US008766082B2

(12) United States Patent
Smith

(10) Patent No.: US 8,766,082 B2
(45) Date of Patent: Jul. 1, 2014

(54) AMPLIFIER WITH SELECTABLE MASTER CONTROL

(75) Inventor: Randall C. Smith, Petaluma, CA (US)

(73) Assignee: Mesa/Boogie, Ltd., Petaluma, CA (US)

( * ) Notice: Subject to any disclaimer, the term of this patent is extended or adjusted under 35 U.S.C. 154(b) by 782 days.

(21) Appl. No.: 12/928,842

(22) Filed: Dec. 21, 2010

(65) Prior Publication Data
US 2012/0152089 A1    Jun. 21, 2012

(51) Int. Cl.
*G10H 1/36* (2006.01)
(52) U.S. Cl.
USPC .......................... 84/735; 381/120
(58) Field of Classification Search
USPC ........................... 381/120; 84/735
See application file for complete search history.

(56) References Cited

U.S. PATENT DOCUMENTS

| | | |
|---|---|---|
| 2,082,478 A | 6/1937 | Beers |
| 2,315,248 A | 3/1943 | De Rosa |
| 3,493,669 A | 2/1970 | Elbrecht |
| 3,566,236 A | 2/1971 | Johnson |
| 3,663,735 A | 5/1972 | Evans |
| 3,673,304 A | 6/1972 | Dudas |
| 3,835,409 A | 9/1974 | Laub |
| 3,860,876 A | 1/1975 | Woods |
| 3,973,461 A | 8/1976 | Jahns |
| 4,150,253 A | 4/1979 | Knoppel |
| 4,180,707 A | 12/1979 | Moog |
| 4,211,893 A * | 7/1980 | Smith ........................ 381/118 |
| 4,286,492 A | 9/1981 | Claret |
| 4,446,440 A | 5/1984 | Bell |
| 4,480,520 A | 11/1984 | Gold |
| 4,495,640 A | 1/1985 | Frey |
| 4,532,476 A | 7/1985 | Smith |
| 4,555,753 A | 11/1985 | Takahashi |
| 4,593,251 A | 6/1986 | Smith |
| 4,644,289 A | 2/1987 | Kennedy et al. |
| 4,701,957 A | 10/1987 | Smith |
| 4,713,624 A | 12/1987 | Smith |
| 5,001,440 A | 3/1991 | Zerod |
| 5,032,796 A | 7/1991 | Tiers et al. |
| 5,091,700 A | 2/1992 | Smith |
| 5,168,438 A | 12/1992 | Smith |
| 5,208,548 A | 5/1993 | Van Riezen |
| 5,546,046 A * | 8/1996 | Trentino ....................... 330/127 |
| 5,550,509 A | 8/1996 | Trentino |
| 5,559,469 A * | 9/1996 | Smith ........................... 330/123 |
| 5,705,950 A | 1/1998 | Butler |
| 5,793,252 A | 8/1998 | Smith |
| 6,111,931 A | 8/2000 | Kusch |
| 6,140,870 A | 10/2000 | Cook |
| 6,522,752 B1 | 2/2003 | Smith |
| 6,895,227 B1 | 5/2005 | Moliere |
| 6,937,093 B2 | 8/2005 | Tekushan |
| 7,053,714 B1 * | 5/2006 | Fields et al. .................. 330/276 |
| 7,173,488 B2 * | 2/2007 | Smith ........................... 330/119 |
| 7,412,064 B2 * | 8/2008 | Smith ........................... 381/118 |
| 7,602,927 B2 | 10/2009 | Smith |

(Continued)

OTHER PUBLICATIONS

Hust, Lloyd B., "Extended Class A Amplifier", Radio and Television News, Sep. 1953, pp. 40-42 & 146-148.

*Primary Examiner* — Jeffrey Donels
(74) *Attorney, Agent, or Firm* — Lewis Roca Rothgerber LLP

(57) ABSTRACT

An amplifier for electric guitar including a Cut control for attenuating high frequencies whose operation is expanded via a switch to alternately function as a Master Volume control.

13 Claims, 4 Drawing Sheets

(56) References Cited

U.S. PATENT DOCUMENTS

| | | | |
|---|---|---|---|
| 2003/0179893 A1* | 9/2003 | Smith | 381/120 |
| 2006/0012424 A1* | 1/2006 | Peavey et al. | 330/118 |
| 2010/0259328 A1* | 10/2010 | Giovannotto | 330/195 |

* cited by examiner

AMPLIFIER WITH SELECTABLE MASTER CONTROL

FIELD OF THE INVENTION

This invention relates to audio amplifiers such as for use with an electric guitar.

BACKGROUND OF THE INVENTION

Guitar players are often fickle with competing requirements for their amplifiers. On the one hand they want simplicity while on the other hand they need versatility. They revere vintage amplifiers for their "classic purity," but then lament the lack of modem features. They demand a certain type and model of amplifier in order to duplicate influential recordings but are then frustrated by the typical limitations of these early designs, the most common being the "one-good-sound-at-one-volume" syndrome. And that's usually too loud!

The fundamental limitation of these vintage amplifiers is that tone is inseparably related to volume. Many of the vintage amplifiers popularized in the 1960s by famous bands such as the Beatles produce preferred tones only when set at or near maximum volume. While such settings are acceptable for many live venues, they are too loud to be useful in a typical home or small club setting. When adjusted to lower volume, the tone suffers as the overdrive, which alters the tone, evaporates completely.

One such vintage amplifier is the Vox AC-30 and its sibling the AC-15. These amplifiers are revered for their unique performance and simple appearance. As testimony to their lasting impact, a modernized version has been introduced by a firm resurrecting the Vox brand name. Furthermore, several copies and derivatives of the original design that have been produced by other manufacturers. But all of these suffer from either being versatile but complex or being faithful to the original but limited in functionality.

Even though the Vox AC-15 and AC-30 amplifiers are rated at a mere 15 or 30 watts respectively, they are surprisingly loud. Moreover, their iconic tones really don't materialize until they are set near the top of the output range via the one simple Volume control This limitation has been dealt with successfully in the past with other circuits, typically by the inclusion of separate controls to regulate preamp output amplitude independent from preamp gain. In many amplifiers one or more extra stages of amplification are added as well. U.S. Pat. No. 4,211,893 ("the '893 patent") of Randall C. Smith presented one such solution by allowing Gain and Loudness to be preset independently and providing two different foot-switchable sounds—a clean one for Rhythm and an overdriven one for Lead. This solution is adequate for many players but necessitates four separate controls, it is a clear departure from the simplicity of an AC type amplifier with its single Volume control. Furthermore, this design may be inadequate for some players and musical styles because the Rhythm mode of the '893 design may have insufficient gain while the Lead mode has too much.

Despite the bare-bones simplicity of the Vox circuit and control panel, the range of gain available from the single Volume control is impressive. Clean sounds at lower settings give way to semi-broken-up sounds to moderately overdriven sounds when the single Volume control is turned up to its maximum. While this range of gain is adequate for many popular styles of music, the most desired sounds only occur at very loud levels, severely limiting the Vox's usefulness especially in smaller venues.

Compounding the problem is that a typical Master attenuator control, coming at the end of the preamp, will not work with the Vox AC type amplifier circuitry. Their original preamp circuit is far too deficient in gain, comprised of only a single triode gain stage ahead of the phase splitter and power tubes. Later Vox AC models added Bass and Treble controls plus a second triode to recover amplitude lost through those tone controls. Even so, there is still not nearly enough gain to obtain usable overdrive characteristics from the preamp alone.

The Vox AC amplifiers compensated for this lack of preamp gain by employing a long-tail driver and push-pull output stage and operating them "open loop," with no negative feedback. The cathode coupled, long-tail phase splitter uses two separate triodes to furnish push-pull drive signals and contributes substantial gain in the process. What's more, it is this "wide open" output section that is clearly fundamental to the unique character and success of the Vox's musical performance.

Another unique aspect of the Vox was the inclusion of a so-called "Cut control" to partially compensate for the initial lack of tone controls and to allow some taming of the brash sounding wide-open output section. This consisted of a capacitor and variable resistor functioning as a high pass filter between the input grids of the push-pull output tubes. Advancing the Cut control clockwise increasingly attenuates high frequencies by decreasing the resistance between the opposing grids such that the high frequencies were selectively cancelled through the capacitor.

SUMMARY OF THE INVENTION

Embodiments of the present invention satisfy the long felt need for providing optionally selectable modern versatility while maintaining performance and appearance. Using the invention of the current disclosure, a Master Volume control may be added to a vintage amplifier, such as the Vox AC-30 and its sibling the AC-15, while preserving the performance and classic appearance of the vintage amplifier.

In one example of an embodiment the amplifier presently disclosed, the same basic controls of the simple Vox panel(s) may be retained. For the early versions these are only two: the Volume control and the Cut control. For later so-called "Top Boost" models, these were complimented by the addition of Treble and Bass controls. Whether retrofitting original Vox amplifiers or creating newly-built recreations as "tributes," the Cut control, in embodiments of the present invention, is modified by adding a switch to optionally alter its function. With this switch in a first state, the potentiometer of the Cut control's circuitry is reconfigured to perform the function of a Master Volume control, enabling the amplifier to produce its iconic overdriven sounds, largely independent of playing loudness. With the switch in a second state, full traditional performance is restored: the Master Volume control circuitry is decoupled from the amplifier circuit. By adding the switch means and altering the traditional Cut control circuitry in accordance with the present invention, a dual-function Cut/Master control is created.

This dual-function Cut/Master control successfully enables a vintage amplifier to deliver its essential tonal character at any volume, thus overcoming the principle limitation or objection to this type of amplifier. The importance of the ability to decouple the Master Volume control circuitry from the amplifier cannot be overstated to the legion of "purists"

who often regard the inclusion of any Master as an illegitimate sacrilege certain to defile vintage tone even when turned up fully.

Further, the dual-function control presently disclosed, especially with an integrated pull-switch, has considerable value for modifying existing Vox and similar amplifiers because the retrofit could be accomplished without the need to alter the control panel with additional holes, pots or switches.

DESCRIPTION OF THE PREFERRED EMBODIMENTS

In order to overcome the lack of preamp gain and provide a successful Master Volume function, in accordance with the present invention a variable resistor is coupled directly between the opposing grids of the push-pull output tubes in a vacuum tube amplifier thereby preserving the gain and overdrive capabilities inherent in long-tailed driver amplifiers. There are a number of ways to accomplish this result and create the dual-function Cut/Master control of the present invention.

In embodiments of the present invention, a switch is used to alternate the function of the dual-function Cut/Master control. The switch has two positions, the Cut position and the Master position. In the Cut position, a variable resistor is coupled in series to a capacitor and both elements are coupled between the opposing grids of the push-pull output tubes. In the Master position, a variable resistor is coupled directly between the opposing grids of the push-pull output tubes.

The preferred mechanical configuration for alternating between the two functions of the dual-function Cut/Master control is a pull-switch integrated with the dial that controls the potentiometer or variable resistors contained in the circuitry of the dual-function Cut/Master control of the present invention. The dial would be labeled something like "Cut/Pull Master." When the user pulls the integrated pull-switch, the functionality of the dial changes from adjusting the Cut control to adjusting the Master Volume control. A switch separated from the dial could also be used, but the amplifier would not retain the simple and traditional visual appeal that is so important to many players.

Figure 1:
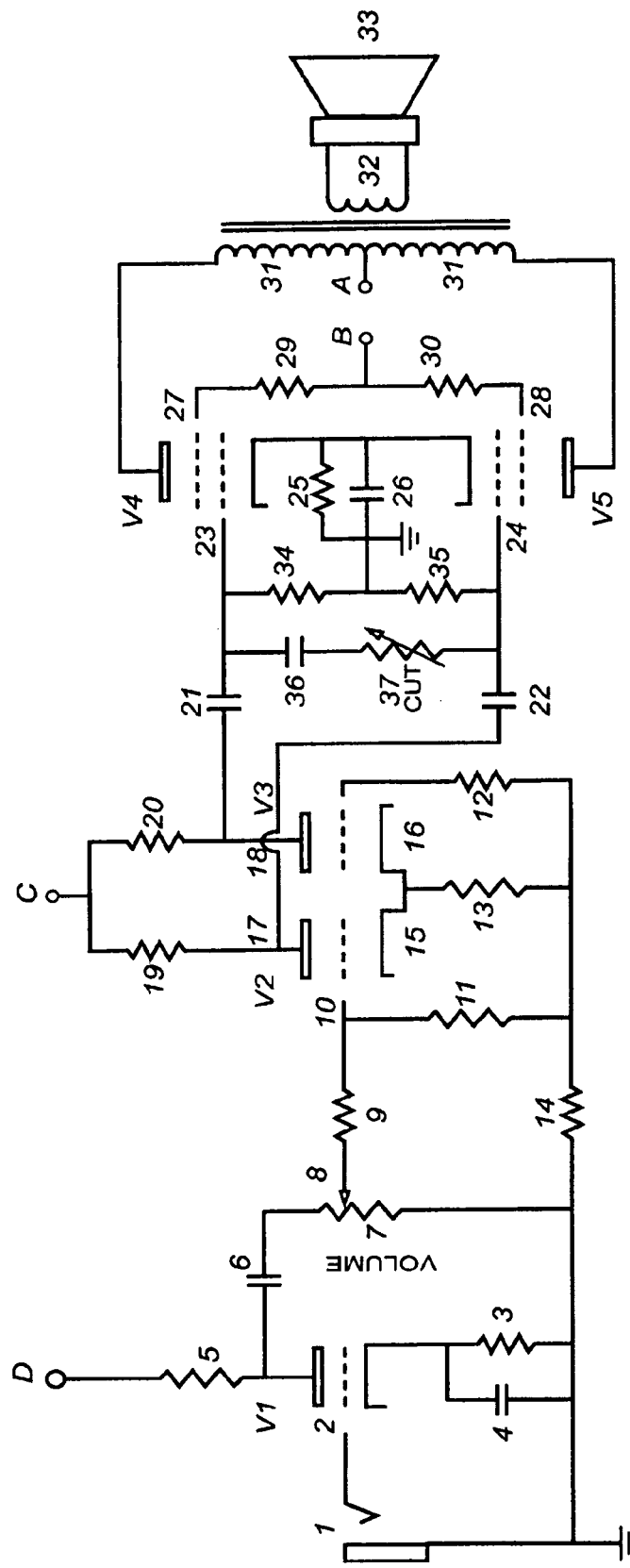
FIG. 1 is a simplified schematic diagram of a prior art Vox AC circuit.

FIG. 1 shows the audio circuitry of the traditional Vox AC amplifier 60. A guitar input terminal 1 is coupled to the grid 2 of the preamplifier vacuum tube V1. This is a basic resistance coupled amplifier with a cathode bias resistor 3 and a bypass capacitor 4. An amplified signal is developed across a plate resistor 5 and AC coupled to the Volume control 7 via the blocking capacitor 6. The Volume control 7 includes a wiper element 8 that is coupled via a resistor 9 to the grid 10 of vacuum tube V2 which is the first of a long-tail vacuum tube pair V2-V3 comprising the phase splitter/driver amplifiers. The resistors 11, 12, 13 and 14 comprise the biasing network of the pair V2-V3 in a typical arrangement that provides signal coupling from a cathode 15 to a cathode 16 to provide amplified opposing phase signals developed across the resistors 19 and 20 from the plates 17 and 18, respectively. A pair of coupling capacitors 21 and 22 deliver AC signals to the grids 23 and 24 of the push-pull output tubes V4 and V5, which are cathode biased via a resistor 25 and a bypass capacitor 26. The screen grids 27 and 28 are fed through the resistors 29 and 30 from a power supply point B. The power supply point A furnishes high-voltage to the plates of V4 and V5 through a primary winding 31 of the output transformer. C and D indicate other high-voltage points of the power supply, which are not shown in this simplified drawing. The secondary winding 32 drives loudspeaker 33.

The resistors 34 and 35 provide grid leak for the grids 23 and 24 respectively. A variable high-pass filter of the capacitor 36 and the variable resistor 37 comprise the Cut control, which functions by selectively canceling out high frequencies at the grids 23 and 24 of the output tubes V4 and V5.

Figure 2:
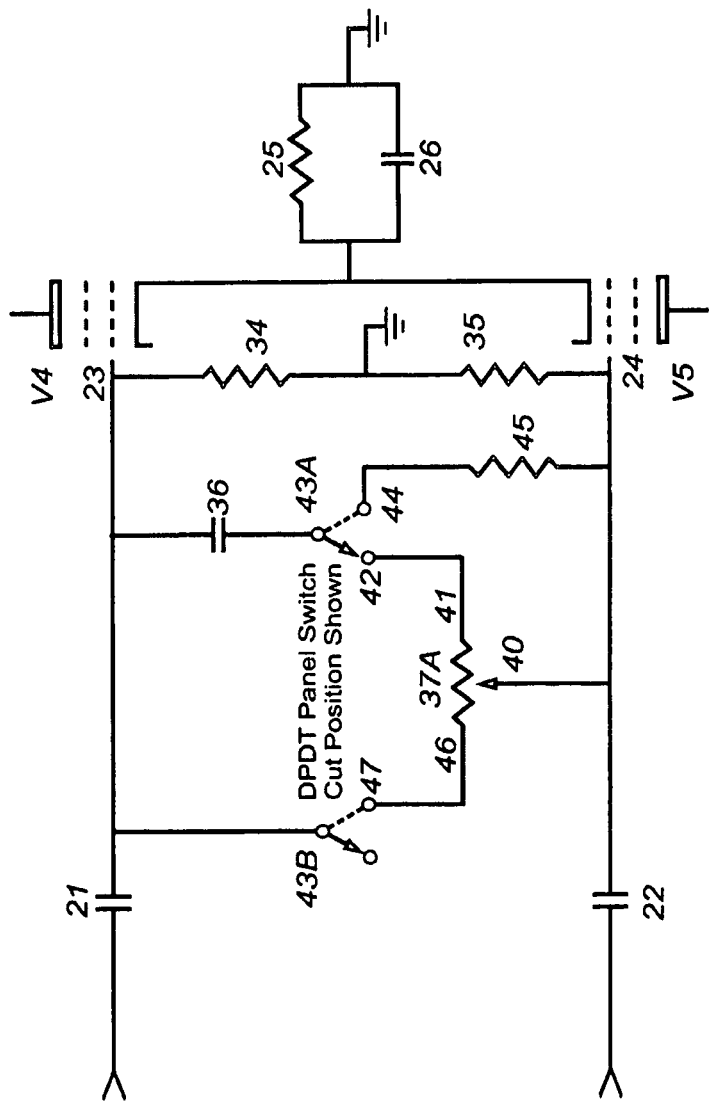
FIG. 2 is a schematic diagram of an example of one embodiment of the present invention.
Figure 3:
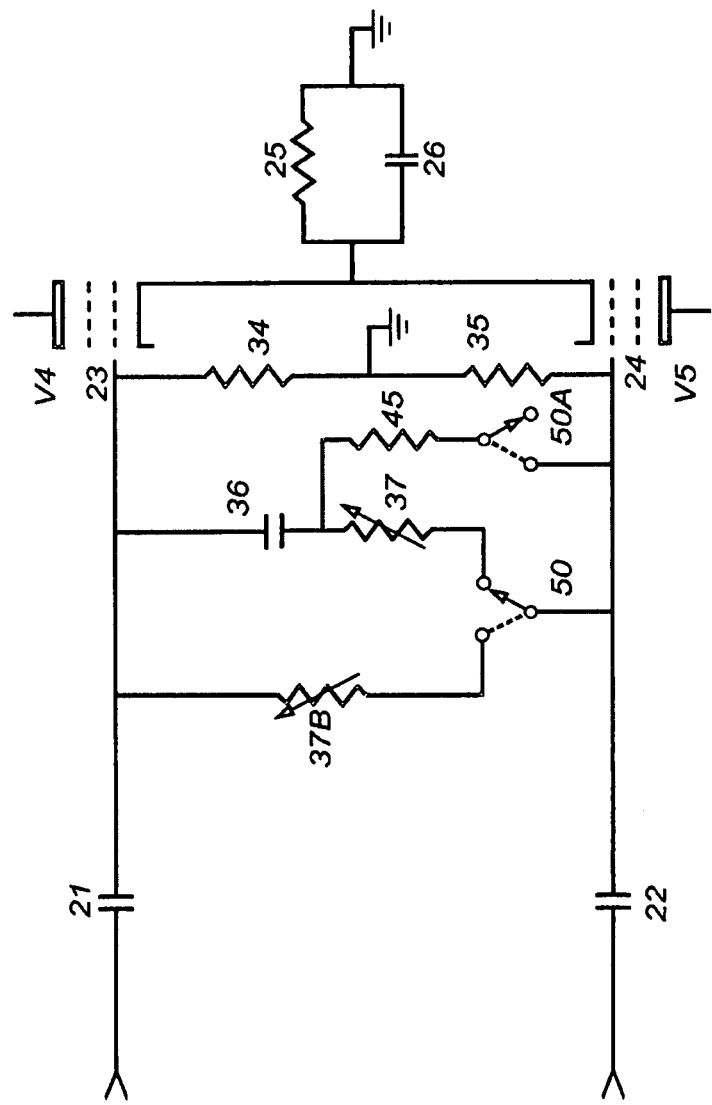
FIG. 3 is a schematic diagram of an example of a second embodiment of the present invention.
Figure 4:
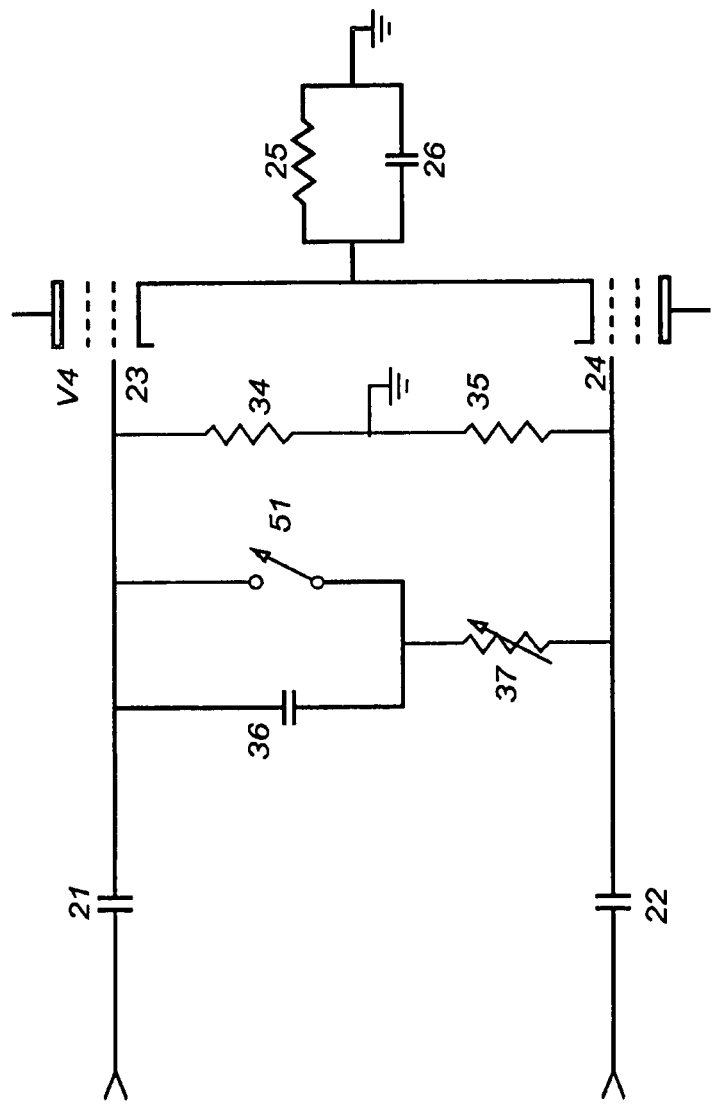
FIG. 4 is a schematic diagram of an example of a third embodiment of the present invention.

FIG. 1 is provided as an example of circuitry that may surround the examples shown in FIGS. 2, 3 and 4. FIGS. 2, 3 and 4 each show examples of embodiments of the present invention. FIGS. 2, 3 and 4 may be used in conjunction with the Vox AC circuitry shown in FIG. 1, or with other push-pull amplifier circuitry.

FIG. 2 is a schematic diagram of an example of an embodiment of the present invention illustrating the circuitry of a power amplification section of an amplifier that includes the dual-function Cut/Master control. In this example, the Cut control 37 of FIG. 1 is replaced with potentiometer 37A. As shown, the potentiometer 37A has its wiper element 40 coupled directly to the grid 24 of the output tube V5 while one end 41 of its fixed element is coupled to terminal 42 of a Double Pole Double Throw (DPDT) switch whose poles are shown at 43A and 43B. The other end 46 of the fixed element of potentiometer 37A is coupled to terminal 47 of the DPDT switch.

In FIG. 2, the DPDT switch is shown in the Cut position. In this position, terminal 41 of potentiometer 37A is coupled to capacitor 36 and the amplifier functions as a traditional push-pull amplifier with a Cut control, for example, the amplifier shown in FIG. 1.

In FIG. 2, when the DPDT switch is in the Master position (as indicated by the dashed lines) the 43B switch segment couples the terminal 46 of the potentiometer 37A to the grid 23 of the output tube V4. This provides a variable attenuation path directly between the grids 23 and 24 of the output tubes V4 and V5 to make potentiometer 37A function as a Master Volume control. Additionally, a capacitor 36 may be coupled through a pole 43A and a switch terminal 44 to couple with a resistor 45 to provide a fixed substitute for the formerly adjustable Cut function.

The circuitry surrounding FIG. 2 may be the circuitry shown in FIG. 1. The output tubes V4 and V5 may be coupled to power supply B and coupled to the output device as shown in FIG. 1. Capacitors 21 and 22 may be coupled to the preamplification circuitry shown in FIG. 1, or other preamplification circuitry.

FIG. 3 is a schematic diagram of an example of another embodiment of the present invention illustrating the circuitry of a power amplification section of an amplifier that includes the dual-function Cut/Master control. In this embodiment, a second variable resistance element 37B is used to form the Master Volume control circuitry. Variable resistance elements 37 and 37B may be ganged to a shared actuator shaft so that one dial may adjust both elements.

In FIG. 3, the switch 50 is shown in the Cut position. In this position, the first variable resistance element 37 is coupled to the capacitor 36 and the amplifier functions as a traditional push-pull amplifier with a Cut control, for example, the amplifier shown in FIG. 1. When the switch 50 is in the Master position, as indicated by the dashed line, the second variable resistance element 37B is coupled between the two grids 23 and 24 of the output tubes V4 and V5. In the Master position, variable resistance element 37B functions as a Master Volume control. In this embodiment, individual resistance tapers may be used in 37 and 37B which would offer customized performance of the Cut control and Master Volume control.

A conventional Master Volume control and a traditional Cut control have opposite functional rotations. The Master Volume control increases the loudness when the control is turned clockwise by increasing the resistance of the variable resistor in the Master's circuitry. A traditional Cut control functions in the opposite direction, decreasing the resistance of the variable resistor when turned clockwise. For this reason, in some embodiments of the present invention, the functional rotation of variable resistance element 37 may be configured to be the opposite of the functional rotation of variable resistance element 37B as shown in FIG. 3. Using opposite functional rotations will make the amplifier operate in a manner that conforms to the user's expectations.

In the embodiment shown in FIG. 3, a second switch element 50A may be included to provide a preset level of the Cut function through the resistor 45 when the amplifier is in the Master position as shown in FIG. 3. As described with respect to FIG. 2, the circuitry surrounding FIG. 3 may be the circuitry shown in FIG. 1.

FIG. 4 is a schematic diagram of an example of another embodiment of the present invention illustrating the circuitry of a power amplification section of an amplifier that includes the dual-function Cut/Master control. In FIG. 4, a switch 51 is used to shunt across the capacitor 36. The potentiometer 37 is configured as a variable resistor. When switch 51 is open, the amplifier is in the Cut position. In this position variable resistor 37 is coupled to the capacitor 36 and the amplifier functions as a traditional push-pull amplifier with a Cut control, for example, the amplifier shown in FIG. 1. When the switch 51 is closed, the amplifier is in the Master position and variable resistor 37 is coupled directly between the two grids 23 and 24 of the output tubes V4 and V5. As described with respect to FIG. 2, the circuitry surrounding FIG. 4 may be the circuitry shown in FIG. 1.

In FIG. 4, the functional rotation of the variable resistor is the same for both the Master Volume control and the Cut control. This may be confusing to users. For example, one way to overcome the confusion would be to would be to re-label the Cut control, calling it "Bright" or "Presence" instead. Then the user's expectation would be that clockwise rotation would increase high frequencies rather than roll them off, as the Cut control traditionally does. Labeling a tone control with another name does not remove it from the scope of the present invention.

In each of the embodiments a variable resistance element such as a variable attenuator or variable resistor, is used. The variable resistance element may comprise a potentiometer or a potentiometer type variable resistor, for example. In some embodiments, the player may adjust the control using a manually-operated dial, but other types of adjusters could be used to adjust the control.

Embodiments of the present invention may be applied to amplifiers other than Vox AC amplifiers. For example, embodiments of the present invention may be used with preamplifier sections different from the preamplifier shown in FIG. 1. Embodiments of the present invention may also be coupled to output configurations different from the configuration shown in FIG. 1.

FIG. 1 shows a typical Vox AC type amplifier, presented as a combo amplifier with a loudspeaker present in the unit. The present invention could be applied to a combo amplifier or to a head unit with an output device capable of being connected to one or more speakers.

The embodiments disclosed above are intended to be illustrative only. One of ordinary skill in the art will recognize that changes may be made to the embodiments described herein without departing from the scope of the invention, which is defined by the claims, below.

What is claimed is:

1. An amplifier for guitar comprising:
   a push-pull amplifier having at least one pair of first and second electron emitting devices, each electron emitting device including an electron source element, an electron receiving element and an electron control element;
   a double-pole switch having a first and second position, and comprising a first segment and a second segment, wherein the second segment is connected to the control element of the first electron emitting device;
   a high-pass capacitor having a first and second terminal, wherein the first terminal is connected to the control element of the first electron emitting device, and the second terminal is connected to the first segment of the double-pole switch; and
   a variable attenuator having a third terminal, a fourth terminal, and a variable wiper element, wherein the variable wiper element is connected to the control element of the second electron emitting device, the third terminal is connected to the first segment of the double-pole switch, and the fourth terminal is connected to the second segment of the double pole switch;
   such that when the switch is in the first position, the first segment of the double-pole switch simultaneously couples the second terminal of the capacitor to the third terminal of the variable attenuator while the second segment decouples the fourth terminal of the variable attenuator from the control element of the first electron emitting device; and
   when the switch is in the second position, the second segment of the double-pole switch simultaneously couples the fourth terminal of the variable attenuator to the control element of the first electron emitting device while the first segment decouples the second terminal of the capacitor from the third terminal of the variable attenuator.

2. The amplifier of claim 1 further comprising a fixed resistance element having a fifth and sixth terminal, wherein the fifth terminal is connected to the first segment of the double-pole switch and the sixth terminal is connected to the control element of the second electron emitting device;
   such that when the switch is in the second position, the first segment of double-pole switch also couples the second terminal of the capacitor to the fifth terminal of the fixed resistance element; and
   when the switch is in the first position, the first segment of the double-pole switch also decouples the second terminal of the capacitor from the fifth terminal of the fixed resistance element.

3. The amplifier of claim 1 further comprising a manually-operated dial to control the variable attenuator.

4. The amplifier of claim 3 further comprising a manually-operated pull switch that is integrated with the manually-operated dial, the dial configured to be manually pulled into a first pull switch position and manually pushed into a second pull switch position, wherein the position of the double-pole switch is changed by the manually-operated pull-switch.

5. An amplifier comprising:
a push-pull amplifier having at least one pair of first and second electron emitting devices, each electron emitting device including an electron source element, an electron receiving element and an electron control element; a single-pole-double-throw switch having a first and second position, and
comprising a first terminal, a second terminal, and a pole, wherein the pole is connected to the control element of the first electron emitting device;
a high-pass capacitor having a third and fourth terminal, wherein the third terminal is connected to the control element of the second electron emitting device;
a first variable resistance element having a fifth and sixth terminal, wherein the fifth terminal is connected to the fourth terminal of the capacitor, and the sixth terminal is connected to the first terminal of the single-pole-double-throw switch; and
a second variable resistance element having a seventh and eighth terminal, wherein the seventh terminal is connected to the control element of the second electron emitting device, and the eighth terminal is connected to the second terminal of the single-pole-double throw switch;
such that when the switch is in the first position, the switch couples the sixth terminal of the first variable resistance element to the control element of the first electron emitting device and decouples the eighth terminal of the second variable resistance element from the control element of the first electron emitting device; and
when the switch is in the second position, the switch couples the eighth terminal of the second variable resistance element to the control element of the first electron emitting device and decouples the sixth terminal of the first variable resistance element from the control element of the first electron emitting device.

6. The amplifier of claim 5 further comprising:
a fixed resistance element having a ninth and tenth terminal, wherein the ninth terminal is connected to the fourth terminal of the capacitor; and
a single-pole-single-throw switch having an eleventh and twelfth terminal, wherein the eleventh terminal is connected to the tenth terminal of the fixed resistance element and the twelfth terminal is connected to the control element of the first electron emitting device;
such that when the single-pole-double-throw switch is in the second position, the single-pole-single-throw switch also couples the tenth terminal of the fixed resistance element to the control element of the first electron emitting device; and
when the single-pole-double-throw switch is in the first position, the single-pole-single-throw switch also decouples the tenth terminal of the fixed resistance element from the control element of the first electron emitting device.

7. The amplifier of claim 5 further comprising an actuator shaft, wherein the first variable resistance element and the second variable resistance element are ganged to the actuator shaft.

8. The amplifier of claim 7 further comprising a dial, wherein:
the resistance of the first variable resistance element decreases and the resistance of the second variable resistance element increases when the dial is turned clockwise; and
the resistance of the first variable resistance element increases and the resistance of the second variable resistance element decreases when the dial is turned counterclockwise.

9. The amplifier of claim 8 further comprising a manually-operated dial to control the first variable resistance element and the second variable resistance element.

10. The amplifier of claim 9 further comprising a manually-operated pull switch that is integrated with the manually-operated dial wherein the position of the single-pole-double-throw switch and the position of the single-pole-single-throw switch is changed by the manually-operated pull-switch, the manually-operated dial configured to be manually pulled into a first pull switch position and manually pushed into a second pull switch position.

11. An amplifier comprising:
a push-pull amplifier having at least one pair of first and second electron emitting devices, each electron emitting device including an electron source element, an electron receiving element and an electron control element;
a switch having a first and second position;
a variable resistance element having a first and second terminal, wherein the first terminal is coupled to the control element of the first electron emitting device and the second terminal is coupled to the switch; and
a high-pass capacitor having a third and fourth terminal, wherein the third terminal is coupled to the switch and the fourth terminal is coupled to the control element of the second electron emitting device;
such that when the switch is in the first position, the second terminal of the variable resistance element is coupled to the third terminal of the capacitor, and the second terminal of the variable resistance element is decoupled from the control element of the second electron emitting device; and
when the switch is in the second position, the second terminal of the variable resistance element is coupled to the control element of the second electron emitting device and the second terminal of the variable resistance element is decoupled from the third terminal of the capacitor.

12. The amplifier of claim 11 further comprising a manually-operated dial to control the variable resistance element.

13. The amplifier of claim 12 further comprising a manually-operated pull switch that is integrated with the manually-operated dial wherein the position of the switch is changed by the manually-operated pull-switch, the manually-operated dial configured to be manually pulled into a first pull switch position and manually pushed into a second pull switch position.

* * * * *